United States Patent

Nakamura

Patent Number: 5,373,176
Date of Patent: Dec. 13, 1994

[54] STRUCTURALLY MATCHED FERROELECTRIC DEVICE

[75] Inventor: Takashi Nakamura, Kyoto, Japan
[73] Assignee: Rohm Co., Ltd., Kyoto, Japan
[21] Appl. No.: 924,841
[22] Filed: Aug. 4, 1992
[30] Foreign Application Priority Data
Aug. 16, 1991 [JP] Japan ................... 3-205876
[51] Int. Cl.⁵ .............. H01L 27/22; H01L 29/82; H01L 29/96; H01L 49/00
[52] U.S. Cl. ...................... 257/295; 257/77; 257/78
[58] Field of Search ............ 257/295, 77, 78
[56] References Cited

U.S. PATENT DOCUMENTS 3,832,700  8/1974  Wu et al. ................. 340/173.2

FOREIGN PATENT DOCUMENTS 0624370  1/1987  Japan.
3203084  9/1991  Japan.

OTHER PUBLICATIONS

Dreifus et al., "Diluted Magnetic Semiconductor (CdMnTe) SchottKy. Diodes and FETs", Appl. Phys. Lett., 53(14), Oct. 3, 1988.

Primary Examiner—Andrew J. James
Assistant Examiner—Valencia M. Wallace
Attorney, Agent, or Firm—Brumbaugh, Graves, Donohue & Raymond

[57] ABSTRACT

A ferroelectrics device includes a semiconductor substrate having a diamond structure or zinc blend structure, and a ferroelectric compound film formed on the semiconductor substrate by selective epitaxial growth. The ferroelectric compound film is made of a mixed crystal of at least three components in groups II and VI and has the same structure as the semiconductor substrate.

3 Claims, 1 Drawing Sheet

FIG. 1
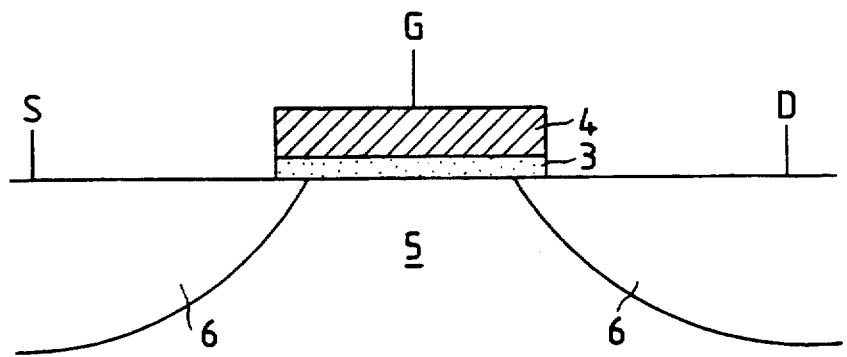
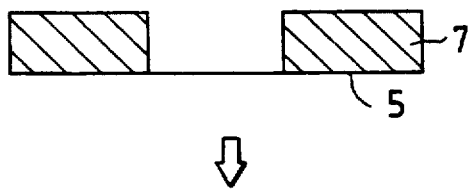
FIG. 2(A)
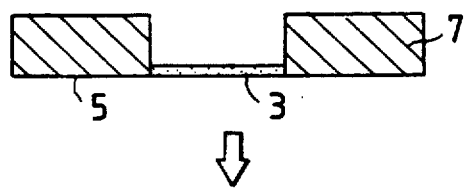
FIG. 2(B)
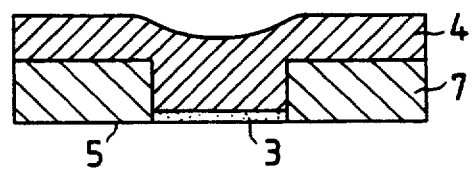
FIG. 2(C)
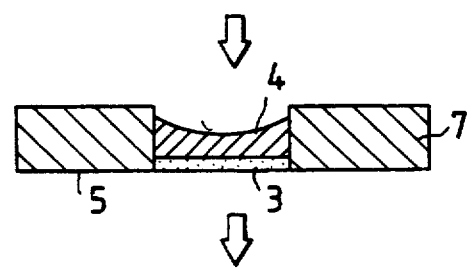
FIG. 2(D)
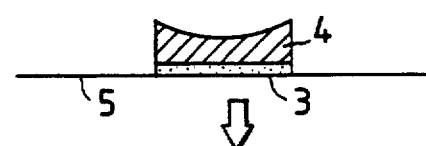
FIG. 2(E)
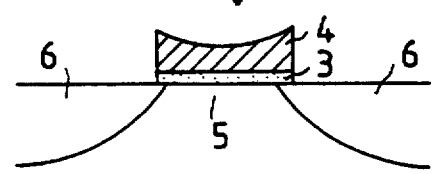
FIG. 2(F)

STRUCTURALLY MATCHED FERROELECTRIC DEVICE

BACKGROUND OF THE INVENTION

This invention relates to ferroelectrics devices such as ferroelectrics memories and ferroelectrics capacitors in which an extremely thin film of ferroelectrics excellent in crystalline characteristic is formed on a semiconductor substrate.

For instance U.S. Pat. No. 3,832,700 has proposed a FET (field-effect transistor) having an MFS (metal-ferroelectrics-semiconductor) structure as an application of the ferroelectrics device. Thereafter, use of ferroelectrics having a perovskite structure such as PZT (Pb (Zr, Ti) $O_3$) has been tried for manufacture of the FET; however, it has not been realized due to a number of problems to be solved.

That is, the conventional ferroelectrics device is disadvantageous in the following points: In the device, the ferroelectrics is greatly mismatched (for instance in lattice constant) with the base material, namely, the semiconductor substrate, so that the formed ferroelectrics film is low in film quality. Furthermore, in manufacture of the ferroelectrics device, the components of the ferroelectrics are injected into the semiconductor, which makes it difficult to give excellent electrical characteristics to the ferroelectrics device. In addition, film formation and processing of the ferroelectrics material may damage the semiconductor substrate. This difficulty may be eliminated by provision of an intermediate layer (such as $SiO_2$ or SiN). However, since it is low in dielectric constant, it is impossible to operate the ferroelectrics device without application of high voltage. Thus, in the case of the conventional ferroelectrics device, it is difficult to provide a thin film of ferroelectrics.

SUMMARY OF THE INVENTION

Accordingly, an object of this invention is to provide a ferroelectrics device which is free from the above-described difficulties accompanying a conventional ferroelectrics device. In the ferroelectrics device of the invention, an MFS structure is provided without damaging the semiconductor substrate, and a ferroelectrics film excellent in crystalline characteristic is formed. Furthermore, in the device, the ferroelectrics film formed is extremely small in thickness.

The foregoing object of the invention has been achieved by the provision of a ferroelectrics device such as a ferroelectrics memory or a ferroelectrics capacitor operating on the remanent polarization and polarization inversion of ferroelectrics, in which, according to the invention, on a semiconductor substrate having a diamond structure or zinc blende structure, a ferroelectric compound film of a mixed crystal having more than two different atoms, which has the same structure as the semiconductor substrate, is formed. In the device, the atoms are Zn, Cd and Te, and the compound film is formed by selective epitaxial growth.

That is, in the ferroelectrics device of the invention, the ferroelectrics film is similar in structure to the semiconductor substrate, and can be grown selectively, for instance, by MBE (molecular beam epitaxy). More specifically, the semiconductor substrate and the mixed crystal formed on it are so selected that they are matched with each other in structure and in lattice constant, so that the selective epitaxial growth of the ferroelectrics film can be achieved with a layer of amorphous material such as $SiO_2$ as a mask.

In the above-described ferroelectrics device of the invention, the amount of mismatch in lattice constants between the semiconductor substrate and the ferroelectrics film is less, and therefore the ferroelectrics film excellent in crystalline characteristic can be obtained. In addition, the selective epitaxial growth makes it unnecessary to further process the ferroelectrics film thus formed. Furthermore, the ferroelectrics film is formed through excellent epitaxial growth, so that injection of impurities into the semiconductor substrate is prevented. In addition, the state of an interface is excellent, which prevents the crystalline characteristic from being lowered by the polarization inversion.

BRIEF DESCRIPTION OF THE DRAWINGS

FIG. 1 is an explanatory diagram showing an example of a ferroelectrics device according to this invention, and FIGS. 2(A) and 2(F) are explanatory diagrams for a description of a method of manufacturing the ferroelectrics device shown in FIG. 1.

DETAILED DESCRIPTION OF THE PREFERRED EMBODIMENTS

Preferred embodiments of this invention will be described with reference to the accompanying drawings in detail.

FIG. 1 outlines the structure of an MFSFET. In FIG. 1, reference numeral 5 designates a semiconductor substrate; 6, an impurities injection layer; 3, a film of ferroelectrics ZCT ($Zn_x$ ($Cd_{1-x}Te$)) formed on the semiconductor substrate 5; and 4, a gate electrode formed on the film 3. Further in FIG. 1, reference character G designates the gate of the MFSFET; S, the source; and D, the drain.

The MFSFET is an FET which performs a switching operation by utilization of electric charges due to the remanent polarization of ferroelectrics. With the MFSFET, even when the voltage is zero, the logic levels "0" and "1" can be determined from the direction of the remanent polarization. Thus, the MFSFET can be employed as a non-volatile RAM. Heretofore, it is rather difficult to put the MFSFET in practical use because it has a number of problems to be solved. This invention has solved those problems, thus permitting the practical use of the MFSFET.

An example of a method of manufacturing the MFSFET using ZCT as shown in FIG. 1 will be described with reference to FIGS. 2(A) through 2(F). First, a CdTe substrate 5 is masked, for instance, with a masking layer 7 of $SiO_2$ except for a predetermined region where a ZCT layer is to be formed (FIG. 2(A)). Next, the ZCT layer 3 is grown on the predetermined region by MBE (molecular beam epitaxy) (FIG. 2(B)). Thereafter, a film 4 (of poly-Si or the like) to be formed into a gate electrode is formed on the ZCT layer (FIG. 2(C)). The gate electrode material on the masking layer is removed by etchback so that it remains only on the ZCT layer (FIG. 2(D)), and then the masking layer is removed by wet etching (FIG. 2(E)). Finally, a diffusion layer 6 is formed by doping impurities such as Ge and Si (FIG. 2(F)).

Specific features of the above-described manufacturing method reside in that it is unnecessary to further process the ferroelectrics film thus formed because it has been selectively grown, and the MBE technique is employed for epitaxial growth with no mismatch (for instance in lattice constant) with the substrate. In addition to the above-described material, theoretically a mixed crystal of Pb, Ge and Te may be employed; however, it should be noted that the mixed crystal, being unstable, may give rise to a ferroelectric phase transition, and it may be used only in a range of extremely low temperatures because it is low in carry temperature.

In general, compounds in groups II and VI or III and V show no ferroelectricity when they are of two components; however, some of the compounds show ferroelectricity when they are of three or more components. For instance, $Zn_xCd_{1-x}Te$, a mixed crystal in groups II and VI, has a zinc blende structure, and shows no ferroelectricity with $x=0$ or $1$, but shows ferroelectricity with $0 < x < 1$. Its transition temperature changes in a range of from 90° C. to 245° C. depending on the composition, and its spontaneous polarization occurs in a direction of [111]. The spontaneous polarization occurs since the Cd or Zn ion moves in the direction of [111] with respect to the lattice of Te.

The mechanism is not known yet why the Cd or Zn ion displaces with respect to a fundamental unitary lattice of Te which is like a regular tetrahedron structure. However, with respect to the mechanism, the following may be considered: the band becomes unstable because the state of electrons changes with the displacement of the Cd or Zn ion, the mode of vibration becomes unstable because of the interaction of atoms (such as Coulomb force or dipole-dipole interaction), and the order also becomes unstable because of the difference in radius between the ions.

Thus, in the use of a mixed crystal of at least three components in groups II and VI, it is unnecessary to process the formed ferroelectrics film if it is selectively grown during manufacture, which makes the manufacture simple. Furthermore, the formed ferroelectrics film is extremely small in thickness, which makes the subsequent flattening process easy. In addition, the ferroelectrics film is excellent in crystalline characteristic, so that the number of times of polarization inversion is improved. Moreover, because the ferroelectrics film is extremely thin, the voltage required for polarization inversion can be decreased.

As was described above, the specific feature of the ferroelectrics device according to the invention resides in that on a semiconductor substrate having a diamond structure or zinc blende structure, a ferroelectric compound film of a mixed crystal of at least three components in groups II and VI, which has the same structure as the semiconductor substrate, is formed. The MFS structure is formed without damaging the semiconductor substrate. In addition, the ferroelectrics film excellent in crystalline characteristic is formed, and the film thus formed is extremely small in thickness. Hence, the amount of mismatch in lattice constant between the semiconductor substrate and the ferroelectrics film is less, and therefore the ferroelectrics film excellent in crystalline characteristic can be obtained. In addition, the selective epitaxial growth makes it unnecessary to further process the ferroelectrics film thus formed. Furthermore, the ferroelectrics film is formed through excellent epitaxial growth, so that injection of impurities into the semiconductor substrate is prevented. In addition, the state of an interface is excellent, which prevents the crystalline characteristic from being lowered by the polarization inversion.

What is claimed is:

1. A ferroelectrics device, comprising:
   a semiconductor substrate having a diamond structure or zinc blende structure; and
   a ferroelectric compound film formed on said semiconductor substrate, said ferroelectric compound film being made of a mixed crystal of at least three components in groups II and VI and having the same structure as said semiconductor substrate.

2. A ferroelectrics device as claimed in claim 1, wherein said three components of said compound film are Zn, Cd and Te.

3. A ferroelectrics device as claimed in claim 1, wherein said compound film is formed by selective epitaxial growth.

* * * * *